(12) United States Patent
Sato

(10) Patent No.: US 8,404,979 B2
(45) Date of Patent: Mar. 26, 2013

(54) COMPOSITE MULTILAYER WIRING BOARD

(75) Inventor: Junya Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 284 days.

(21) Appl. No.: 12/600,677

(22) PCT Filed: Apr. 2, 2008

(86) PCT No.: PCT/JP2008/056582
§ 371 (c)(1),
(2), (4) Date: Nov. 18, 2009

(87) PCT Pub. No.: WO2008/146538
PCT Pub. Date: Dec. 4, 2008

(65) Prior Publication Data
US 2010/0147566 A1 Jun. 17, 2010

(30) Foreign Application Priority Data

May 18, 2007 (JP) ................... 2007-132710

(51) Int. Cl.
*H05K 1/03* (2006.01)
(52) U.S. Cl. ............ 174/256; 174/255; 174/258
(58) Field of Classification Search .......... 174/250–266; 361/679.34
See application file for complete search history.

(56) References Cited

U.S. PATENT DOCUMENTS

| | | | | |
|---|---|---|---|---|
| 3,007,997 A * | 11/1961 | Panariti | .................. | 174/262 |
| 3,083,259 A * | 3/1963 | Wells | .................. | 174/255 |
| 3,160,549 A * | 12/1964 | Caldwell et al. | .......... | 428/317.3 |
| 3,813,582 A * | 5/1974 | Gikow | .................. | 361/753 |
| 4,053,943 A * | 10/1977 | Galvin | .................. | 361/757 |
| 5,552,209 A * | 9/1996 | McCutcheon | .............. | 428/209 |
| 5,619,018 A * | 4/1997 | Rossi | .................. | 174/261 |
| 7,608,314 B2 * | 10/2009 | Plant | .................. | 428/86 |
| 2004/0171321 A1 | 9/2004 | Plant | | |

FOREIGN PATENT DOCUMENTS

| | | |
|---|---|---|
| CN | 1607912 A | 4/2005 |
| JP | 10-503622 A | 3/1998 |
| JP | 2002151866 A | 5/2002 |
| JP | 2003304081 A | 10/2003 |
| JP | 2005513248 A | 5/2005 |
| JP | 2005514222 A | 5/2005 |
| JP | 3698091 B | 7/2005 |
| JP | 2006173152 A | 6/2006 |
| JP | 2006186058 A | 7/2006 |
| WO | 2003055339 A | 7/2003 |

OTHER PUBLICATIONS

International Search Report for PCT/JP2006/056582 mailed Jul. 8, 2008.
Chinese Office Action for CN200880016572.1 issued Oct. 28, 2010.

* cited by examiner

*Primary Examiner* — Angel R Estrada
*Assistant Examiner* — Dimary Lopez

(57) ABSTRACT

Electronic components on a printed wiring board can be protected from the impact force of a fall, whereby the electrical and mechanical reliability of the electronic apparatus components can be greatly improved, and moreover, smaller size, lighter weight, higher functionality, and greater multi-functionality can be achieved. The composite multilayer wiring board of the present invention includes a plurality of intermediate layers each interposed between a plurality of printed wiring boards, at least one of the plurality of intermediate layers being composed of a resin material having a dilatancy characteristic.

10 Claims, 14 Drawing Sheets

(a)

(b)

(c)

(a)

(b)

(c)

(a)

(b)

(c)

(a)

(b)

(c)

(a)

(b)

(c)

(a)

(b)

(c)

(a)

(b)

(c)

COMPOSITE MULTILAYER WIRING BOARD

This application is the National Phase of PCT/JP2008/056582, filed Apr. 2, 2008, which claims priority based on Japanese Patent Application No. 2007-132710 for which application was submitted on May 18, 2007 and incorporates all of the disclosures of that application.

TECHNICAL FIELD

The present invention relates to the construction of a composite multilayer wiring board that is mounted in an electronic apparatus mainly in the fields of electronics and communication.

BACKGROUND ART

Many types of electronic equipment such as portable telephone devices, PDAs (Personal Digital Assistant) terminals, and notebook personal computer terminals incorporate printed wiring boards that package many electronic components within a limited space. However, advances in achieving smaller size and lighter weight in such electronic equipment have improved the portability, and the potential for being dropped during transport has therefore become extremely high. When the impact force (impact force of a fall) in such falls is applied to the electronic apparatus, the protection of electronic components on the printed wiring board from the impact force of the fall is of crucial importance from the standpoint of the reliability of the electronic apparatus.

At present, various solutions have been proposed as constructions for protecting electronic components on a single printed wiring board incorporated in an electronic apparatus from the impact force of a fall, such as increasing the rigidity of the printed wiring board itself, or reinforcing the securing points between the printed wiring board and the case of the electronic apparatus terminal and increasing the number of these securing points. Additional solutions that have been proposed include the addition of a shock-absorbing material to the entire surface of the printed wiring board or to the securing points between the printed wiring board and electronic apparatus terminal case, and the addition of shock-absorbing material to points of contact between electronic components on the printed wiring board and the electronic apparatus case.

FIG. 1 shows the mounting construction disclosed in Patent Document 1 (JP-A-2003-304081) that has been conventionally adopted for installing a printed wiring board.

This is a construction in which a board-installing tool equipped with housing 1904 and two board support members 1901 secured to housing 1904 is prepared to install printed wiring board 1905 on which LSI package 1908 is mounted. Printed wiring board 1905 is inserted and held in an arched form between board support members 1901 and thus installed in housing 1904.

FIG. 2 shows the mounting construction of a printed wiring board that has been conventionally adopted and disclosed in Patent Document 2 (JP-A-2002-151866).

In this construction, through slot-holes 2004 are provided at positions of printed wiring board 2003 that correspond to each boss 2006 having lower tapped hole 2002 in each corner of case 2001. Printed wiring board 2003 is then mounted on case 2001 by fastening screws 2005 by way of each through slot-hole 2004 to lower tapped hole 2002 of each boss 2006. As a result, although the application of outside mechanical stress case 2001 may cause deformation of case 2001, screws 2005 and bosses 2006 can slide along the slots in the direction in which the slots of through slot-holes 2004 were cut, whereby a configuration is realized for either eliminating the amount of deformation of printed wiring board 2003 or making the amount of deformation of printed wiring board 2003 less than that of case 2001.

FIG. 3 shows the mounting construction disclosed in Patent Document 3 (Japanese Patent No. 3698091) that has been conventionally adopted for mounting a printed wiring board.

In this construction, when circuit board 2101 is held inside apparatus case 2102, the left side of circuit board 2101 is secured to apparatus case 2102 with circuit board 2101 suspended inside apparatus case 2102. A pair of shock-absorbing members 2105 and 2106 is then disposed between the upper and lower surfaces of this circuit board 2101 and the corresponding upper and lower surfaces inside apparatus case 2102, whereby circuit board 2101 is interposed and held between the pair of shock-absorbing members 2105 and 2106. Thus, even if an impact force applied to apparatus case 2102 is conveyed to circuit board 2101, the pair of shock-absorbing members 2105 and 2106 disposed on both the upper and lower surfaces of circuit board 2101 can limit any warp deformation of circuit board 2101. In addition, the shock conveyed to circuit board 2101 can be mitigated by the pair of shock-absorbing members 2105 and 2106. As a result, a construction is realized in which an impact force applied to apparatus case 2102 is not conveyed, as is, to circuit board 2101 and this construction can thereby prevent damage to circuit board 2101.

Problems inherent to the above-described background art are next considered.

The electronic components on a printed wiring board are normally electrically and mechanically connected to the electrical wiring that is formed on the printed wiring board by using an electrical connection material such as solder. As a result, when the impact force of a fall is applied to the printed wiring board, the electrical connections such as solder are subjected to excessive stress, whereby defects such as the breakage or peeling of the electrical connections may occur, and these defects are a primary factor in greatly reducing electrical and mechanical reliability. Regarding the behavior of the printed wiring board at such times, the impulsive external force resulting from the impact force of a fall is applied to the printed wiring board, and due to this impulsive external force, the printed wiring board bends greatly in the same direction as the direction of application of the impact force of the fall (initial amplitude). The printed wiring board then undergoes damped vibration (residual vibration) at the natural frequency of the printed wiring board, and then comes to rest. When a defect occurs in a solder connection due to a single fall, it is thought that this defect is generated as follows. The large deformation resulting from the initial amplitude of the printed wiring board causes a large distortion in the interface of the electrical wiring and solder bonding layer (alloy layer) formed on the printed wiring board that exceeds the elastic stress limit, leading to brittle fracture of the solder connection. On the other hand, when a problem does not occur due to a single fall but a defect occurs in solder connections due to a succession of falls, the defect is believed to be generated as follows. The repeated vibrations resulting from the residual vibration of the printed wiring board cause the repeated generation of distortion that causes at least a particular fixed stress within the elastic stress limit in the solder material or in the interface of the electrical connections and the solder bonding layer (alloy layer) formed on the printed wiring board, leading to the fatigue fracture of the solder connections.

Essentially, protecting the electronic components on a printed wiring board from the impact force of a fall requires both the reduction of the initial amplitude as well as the decrease of the frequency of residual vibration and realization of early attenuation.

As previously stated, when the impact force of a fall is applied to an electronic apparatus, the protection of the electronic components on the printed wiring board from the impact force of the fall is of crucial importance from the standpoint of the reliability of the electronic apparatus. For this purpose, increasing the rigidity of the printed wiring board itself, reinforcing the securing points between the printed wiring board and the electronic apparatus terminal case, and increasing the number of securing points have all been proposed as constructions for protecting the electronic components on one printed wiring board that is mounted in an electronic apparatus from the impact force of falls. In addition, adding shock-absorbing material to the entire printed wiring board or to the securing points between the printed wiring board and the electronic apparatus terminal case and adding shock-absorbing material to the points of contact between the electronic components on the printed wiring board and the electronic apparatus terminal case have also been proposed.

When measures are adopted such as increasing the rigidity of the printed wiring board itself, reinforcing the securing points between the printed wiring board and the electronic apparatus terminal case, and increasing the number of securing points as previously described, the initial amplitude can be reduced by increasing the spring constant of the vibration system. However, as an unintended consequence, this approach results in an increase in the natural frequency of the printed wiring board and no change in the attenuation factor of the vibration system, whereby the wave number of the residual vibration actually increases.

In addition, adopting measures such as adding shock-absorbing material to the entire surface of the printed wiring board or to the securing points between the printed wiring board and the electronic apparatus terminal case results in a reduction of the natural frequency of the vibration system due to the shock-absorbing material, and further, an increase in the attenuation factor, thereby achieving a decrease of the wave number of residual vibration and early attenuation. In this case, however, the spring constant remains unchanged and the initial amplitude therefore cannot be sufficiently reduced.

In sum, none of these measures is capable of achieving both a reduction of initial amplitude as well as a reduction of the wave number of residual vibration and early attenuation.

In the construction disclosed in Patent Document 1 (JP-A-2003-304081), a printed wiring board is installed in a housing that is in the shape of an arch. This construction is equivalent to increasing the rigidity of the printed wiring board itself. As a result, the initial amplitude can be decreased by increasing the spring constant of the vibration system as previously described, but the natural frequency of the printed wiring board increases, and the attenuation factor of the vibration system remains unchanged, whereby the wave number of the residual vibration, instead of decreasing, becomes greater.

In the construction disclosed in Patent Document 2 (JP-A-2002-151866), if deformation of a case is accompanied by deformation of a printed wiring board that is incorporated in the case that slowly becomes deformed and this deformation approaches a substantially dead weight, the exhibited effect is the maintenance of electrical and mechanical reliability. However, when impulsive outer force such as the impact force of a fall is applied to the case, the printed wiring board is not able to slide along the slot in the direction in which the slots of the through slot-holes have been cut. The resulting situation is therefore no different than if the printed wiring board were fastened by screws to the case.

The construction disclosed in Patent Document 3 (Japanese Patent No. 3698091) is a construction in which both the upper and lower surfaces of a circuit board are held by a pair of shock-absorbing members disposed between the upper and lower surfaces inside an apparatus case, whereby the shock-absorbing material lowers the natural frequency of the vibration system and the raises the attenuation factor. Accordingly, a reduction of the wave number of residual vibration and early attenuation are possible. However, to obtain a sufficient attenuation factor, a material having a low modulus of longitudinal elasticity (Young's modulus) must be selected as the shock-absorbing material. Because the spring constant of the vibration system does not change in this case, a sufficient reduction of the initial amplitude is not possible. In addition, because this is a construction in which both the upper and lower surfaces of the circuit board are held interposed between the pair of shock-absorbing members disposed between the upper and lower surfaces inside the apparatus case, the space between the circuit board and the case is occupied by the shock-absorbing members. As a result, this construction is unable to cope with increases in circuit scale that accompany higher functionality and greater multifunctionality, and further, does not allow smaller and lighter constructions.

As previously stated, none of the constructions for mounting a printed wiring board that have been adopted conventionally was capable of achieving both a reduction of the initial amplitude, and early attenuation of residual vibration as well as a reduction of the wave number of residual vibration. Consequently, these constructions were incapable of protecting electronic components on a printed wiring board from the impact force of a fall and were incapable of guaranteeing reliability of the electronic apparatus, and moreover, were incapable of achieving smaller size and lighter weight.

DISCLOSURE OF THE INVENTION

It is an object of the present invention to provide a composite multilayer wiring board that can solve the problems inherent in the above-described background art.

An exemplary object of the present invention is to enable: the protection of electronic components on a printed wiring board from the impact force of a fall, the realization of a major improvement in the electrical and mechanical reliability of an electronic apparatus, and the achievement of smaller size, lighter weight, higher functionality, and greater multifunctionality.

More specifically, the present invention, by both reducing initial amplitude as well as reducing the wave number of residual vibration and by enabling early attenuation, prevents failures such as breakage and peeling resulting from excessive stress that is applied to electrical connections between a printed wiring board and electronic components despite the application of an impulsive external force such as the impact force of a fall on a printed wiring board. In addition, the present invention protects electronic components from the impact force of a fall without requiring special constraints on the printed wiring board securing locations, or the addition of space or extra parts such as the adhesion of shock-absorbing material to the outer layer surface.

An exemplary aspect of the present invention for achieving the object of the present invention is a composite multilayer wiring board that includes a plurality of printed wiring boards and a plurality of intermediate layers that are each interposed between a plurality of the printed wiring boards. At least one of the plurality of intermediate layers is composed of a resin material that has a dilatancy characteristic.

BEST MODE FOR CARRYING OUT THE INVENTION

The present invention is a composite multilayer wiring board composed of at least three layers in which intermediate layers are interposed between a plurality of printed wiring boards wherein the intermediate layers are composed of a resin material having a dilatancy characteristic. Thus, when an impulsive external force due to the impact force of a fall is applied to the printed wiring board, both a reduction of the initial amplitude, and early attenuation of residual vibration as well as a reduction of the wave number of residual vibration can be achieved.

Figure 1:
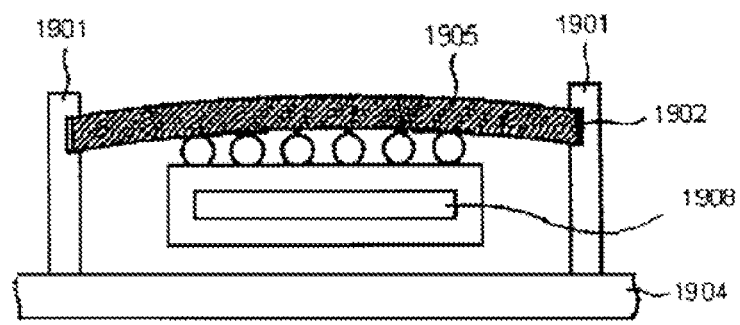
FIG. 1 is an explanatory view of an example of the related art according to Patent Document 1.
Figure 2:
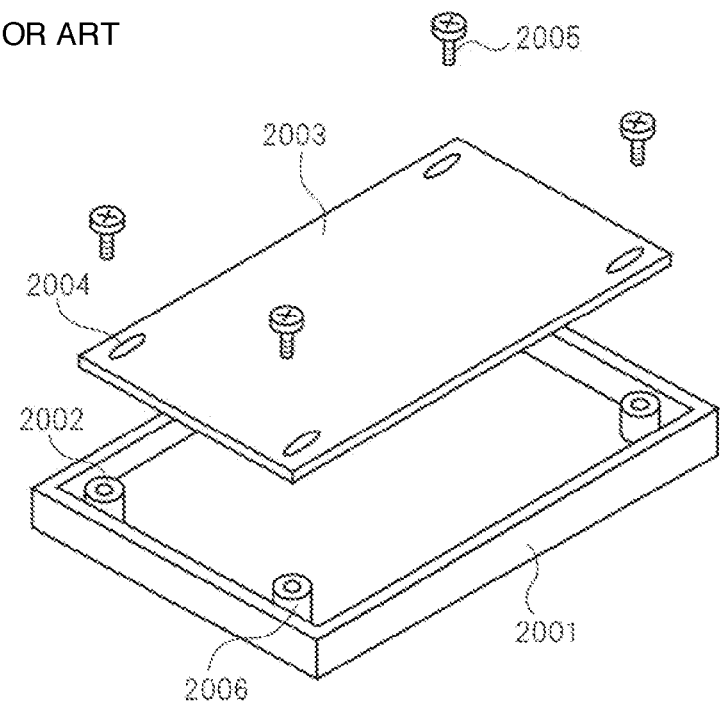
FIG. 2 is an explanatory view of an example of the related art according to Patent Document 2.
Figure 3:
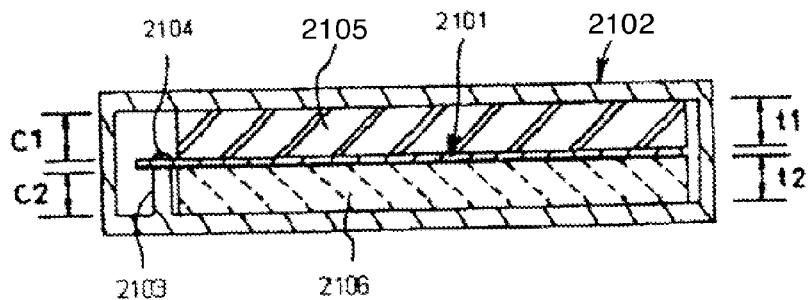
FIG. 3 is an explanatory view of an example of the related art according to Patent Document 3.
Figure 4:
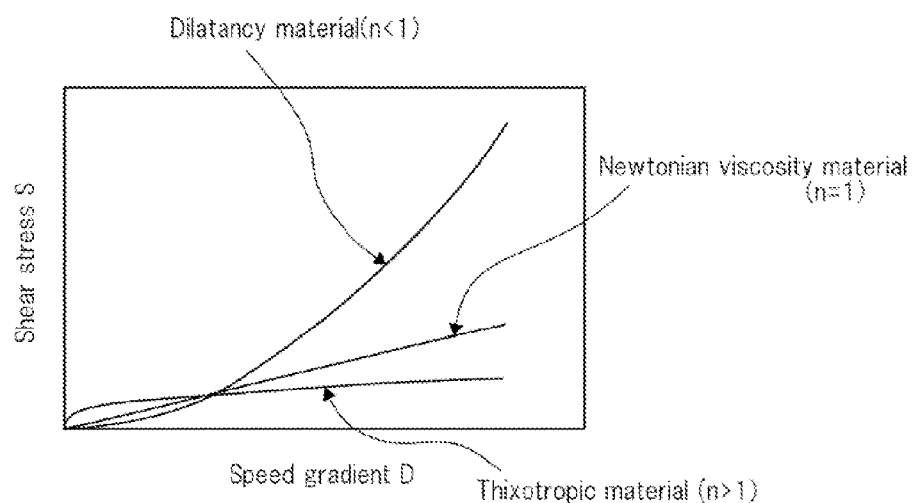
FIG. 4 is a characteristics chart showing the relation between speed gradient D and shear stress S of an intermediate layer resin used in the present invention.

The dilatancy characteristic here referred to is a type of nonlinear viscoelasticity in which the shear stress is low in a static environment but in which the shear stress increases sharply according to the shear speed in a dynamic environment. Referring to FIG. 4 that shows the properties of a viscous material represented by Formula 1 in which shear stress is S, viscoelasticity is $\eta_s$, and speed gradient is D, this dilatancy characteristic is a characteristic in which the rate of increase of shear stress S increases sharply according to increase in the speed gradient D when n<1.

When n=1, a Newtonian viscosity material is represented in which shear stress S increases in direct proportion to speed gradient D, and when n>1, a thixotropic material is represented in which the rate of increase of shear stress S decreases according to an increase of speed gradient D.

$$S = \eta_s \cdot D^{1/n} \quad \text{(Formula 1)}$$

The theoretical basis, by which the present invention enables both a reduction of the initial amplitude, and early attenuation of residual vibration as well as a reduction of the wave number of residual vibration, is next explained.

Figure 5:
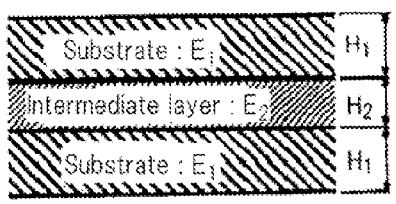
FIG. 5 is a schematic view of a composite three-layer construction realized by adding an intermediate layer between substrates.

First, as shown in FIG. 5, the present invention is considered as a composite three-layer (sandwich-type) board in which an intermediate layer is added between two identical substrates of equal thickness, and the static flexural rigidity B[Nm] of this construction is calculated. Assuming that the substrate thickness is $H_1$ [m], intermediate layer thickness is $H_2$ [m], Young's modulus of the substrates is $E_1$ [Pa], Young's modulus of the intermediate layer is $E_2$ [Pa], shear modulus of the intermediate layer is $G_2$ [Pa], the vibration width is L [m], and the solution of the frequency equation is $\lambda_n$, the flexural rigidity B[Nm] of the composite three-layer board is as shown by Formula 2. Here, shear parameter g and extensional rigidity $K_i$ [N/m] per unit length of layer-i are each represented as shown in Formula 3 and Formula 4, respectively (where $K_2 < K_1$).

$$B = K_1 \frac{H_1^2}{6} + K_1(H_1 + H_2)^2 \frac{g}{1 + 2g} \quad \text{(Formula 2)}$$

$$g = \frac{L^2}{K_1 H_2 \lambda_n^2} G_2 \quad \text{(Formula 3)}$$

$$K_i = E_i H_i \quad \text{(Formula 4)}$$

Based on Formula 2 and Formula 3 and assuming that substrate thickness $H_1$, substrate Young's modulus $E_1$, and intermediate layer thickness $H_2$ are fixed, it can be seen that flexural rigidity B of the composite three-layer board is a hyperbolic function that takes shear parameter g as a variable, and that shear parameter g, which is proportion to the square of the intermediate layer shear modulus $G_2$ and vibration width L, is the dominant parameter.

Here, shear modulus $G_2$ of the intermediate layer is represented by Formula 5 using intermediate-layer Young's modulus $E_2$ and Poisson ratio $v_2$, whereby the dominant parameters for changing flexural rigidity B of the composite three-layer board are intermediate-layer Young's modulus $E_2$ and Poisson ratio $v_2$.

$$G_2 = \frac{E_2}{2(1 + v_2)} \quad \text{(Formula 5)}$$

Based on the formula above, the initial amplitude due to the impact force of a fall (which can be approximated by static deformation) can be reduced by adopting a composite three-layer board construction that takes a material having a Young's modulus of at least a fixed value as the intermediate layer. However, a material with a high Young's modulus has a low attenuation factor and therefore cannot limit residual vibration (dynamic deformation).

Constructions are here separately examined in which a resin material similar to the intermediate layer of the present invention is disposed on one surface or both surfaces of a single substrate. In other words, a composite two-layer board construction in which a resin layer that is a dilatancy material is arranged on one surface of a base material as in FIG. 6 and a composite three-layer board construction in which a resin layer that is a dilatancy material is disposed on both surfaces of a substrate as in FIG. 7 are considered.

Figure 6:
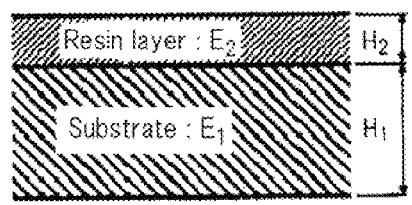
FIG. 6 is a schematic view of a composite two-layer construction realized by arranging a resin layer on one surface of a substrate.
Figure 7:
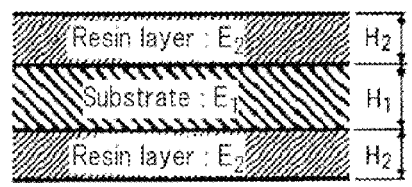
FIG. 7 is a schematic view of a composite three-layer construction realized by arranging resin layers on both surfaces of a substrate.

Assuming that the substrate thickness is $H_1$ [m], the resin layer thickness is $H_2$ [m], the substrate Young's modulus is $E_1$ [Pa], and the resin-layer Young's modulus is $E_2$ [Pa], the flexural rigidity B [Nm] of the composite boards of FIGS. 6 and 7 are as shown by Formula 6 and Formula 7, respectively.

$$B = B_1 \frac{1 + 2a(2\xi + 3\xi^2 + 2\xi^3) + a^2\xi^4}{1 + a\xi} \quad \text{(Formula 6)}$$

$$B = B_1(1 + 2a\xi(3 + 6\xi + 4\xi^2)) \quad \text{(Formula 7)}$$

In these formulas:

$$\xi = \frac{H_2}{H_1} \quad \text{(Formula 8)}$$

$$a = \frac{E_2}{E_1} \quad \text{(Formula 9)}$$

$$B_1 = E_1 I_1 = E_1 \frac{H_1^3}{12} \quad \text{(Formula 10)}$$

Based on Formulas 6, 7, 8, 9, and 10, it can be seen that the combined flexural rigidity of constructions, in which a resin layer similar to the intermediate layer of the present invention is arranged on one surface or both surfaces of a single substrate, is directly proportional to the Young's modulus of the resin layer. In other words, the initial amplitude (which can be approximated by static deformation) resulting from the application of the impact force of a fall can be reduced by adopting a composite two-layer board construction in which a resin layer of a material having a high Young's modulus is disposed on one surface of a single substrate or a composite three-layer board construction in which a resin layer of a material having a high Young's modulus is disposed on both surfaces of a single substrate. However, because a material having a high Young's modulus has a low attenuation factor, and further, because the Young's modulus must be made the same as that of the base material in order to obtain the same compound flexural rigidity as a composite three-layer board construction in which an intermediate layer is added between the two layers of substrates, the suppression of residual vibration (dynamic deformation) is problematic.

Figure 8:
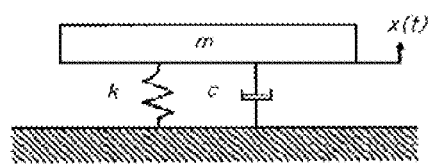
FIG. 8 is a diagram of a dynamic free-vibration model of an attenuation system having a single degree of freedom.
Figure 9:
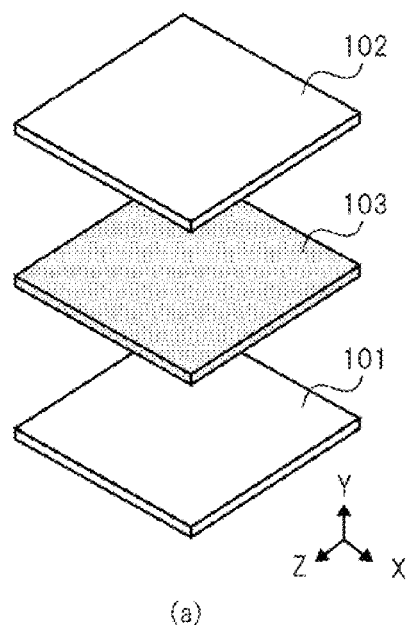
FIG. 9 is an explanatory view of the first embodiment according to the present invention.
Figure 9:
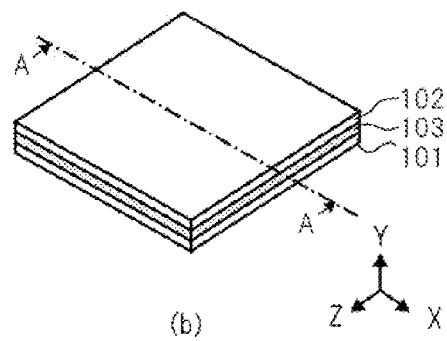
Figure 9:
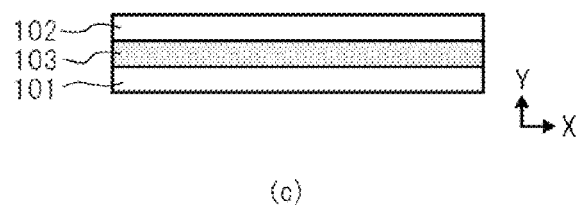

Next, in the interest of simplifying the present invention, a dynamic free-vibration model of an attenuation system having a single degree of freedom as shown in FIG. 8 is considered in which the equation of motion is as shown in Formula 11. In the interest of accuracy, a model of a multi-degree-of-freedom system should be considered, but a single-degree-of-freedom system presents no particular problem because the basic theory of vibration remains the same. If Formula 11 is then solved for function x(t) of time t [s] of the vibration amplitude with initial amplitude as $x_0$ [m], attenuation factor as σ, damped natural angular frequency as $\omega_d$ [rad/s], initial phase angle as φ [rad], the result is as shown in Formula 12. This can be understood to be a vibration waveform that attenuates by $e^{-\sigma}$ in one second at amplitude $x_0 e^{-\sigma t}$. Assuming that the spring constant is k [N/m], that the mass is m [kg], and that the extinction coefficient is c [Ns/m], the undamped natural angular frequency $\omega_n$ [rad/s] and attenuation factor σ are represented as shown in Formula 14.

$$m\ddot{x}(t) + c\dot{x}(t) + kx(t) = 0 \quad \text{(Formula 11)}$$

$$x(t) = x_0 e^{-\sigma t} \cos(\omega_d t + \phi) \quad \text{(Formula 12)}$$

$$\omega_n = \sqrt{\frac{k}{m}} \quad \text{(Formula 13)}$$

$$\sigma = \omega_n \frac{c}{2\sqrt{mk}} \quad \text{(Formula 14)}$$

Based on the above formulas, to achieve both early attenuation and a reduction of the wave number of residual vibration resulting from the application of the impact force of a fall, it is effective to increase attenuation factor σ and decrease the natural angular frequency ω. In other words, it is necessary to decrease spring constant k of the vibration system. Consequently, adopting a composite three-layer board in which a material having a low Young's modulus (i.e., in which spring constant k is small) is used as the intermediate layer is an effective means for the above-described early attenuation and a reduction of the wave number of residual vibration. In this case, however, the effect of reducing the initial amplitude cannot be expected because the compound Young's modulus of the overall vibration system in this case cannot be greatly changed.

In the present invention, however, the resin material that was used in the intermediate layer has a dilatancy characteristic in which the shear stress is low in a static environment but in which the shear stress increases sharply according to the shear speed in a dynamic environment. As a result, the shear stress increases sharply in the high shear speed region that immediately follows the application of the impact force of a fall, whereby the effect of reducing initial amplitude can be obtained. In addition, because the shear speed is within the residual vibration region, the shear stress sharply decreases (i.e., the attenuation factor rises), and the effects of early attenuation and reduction of the wave number of residual vibration can therefore be obtained.

In other words, the composite multilayer wiring board according to the present invention can achieve both a reduction of initial amplitude, and early attenuation as well as a reduction of the wave number of residual vibration when an impulsive external force due to, for example, the impact force of a fall, is applied to the printed wiring board.

An embodiment of a composite multilayer wiring board according to the present invention is next described with reference to the accompanying figures.

First Embodiment

The first embodiment of the composite multilayer wiring board according to the present invention is next described in detail with reference to FIGS. 9 to 13.

Figure 10:
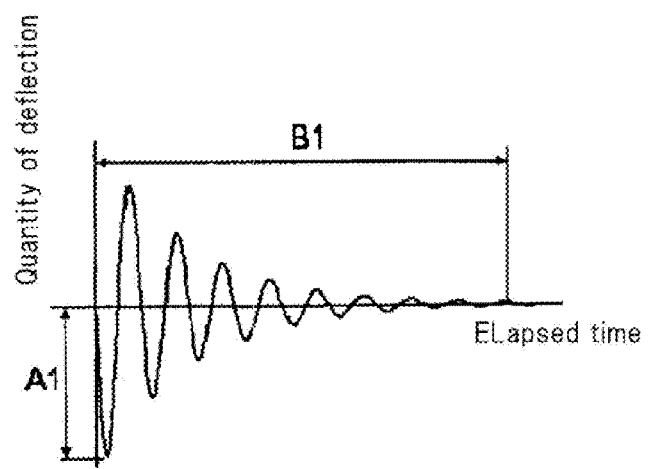
FIG. 10 is a deflection vibration waveform diagram for the case of Comparative Example 1.
Figure 11:
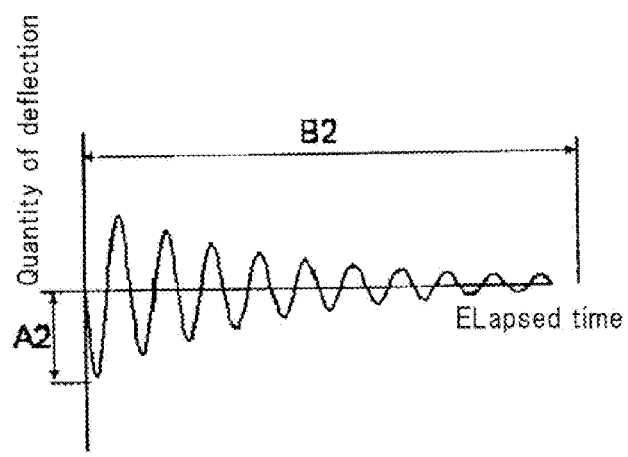
FIG. 11 is a deflection vibration waveform diagram for the case of Comparative Example 2.
Figure 12:
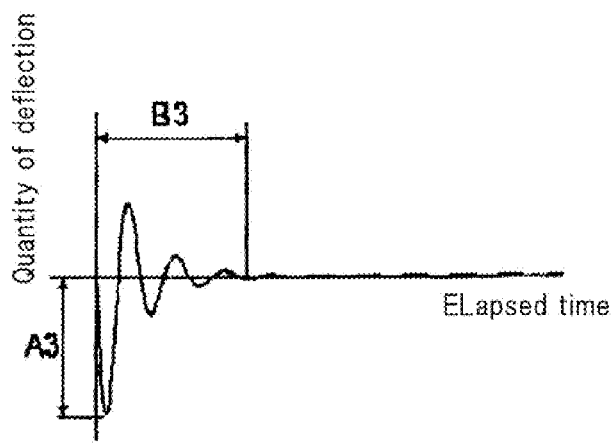
FIG. 12 is a deflection vibration waveform diagram for the case of Comparative Example 3.
Figure 13:
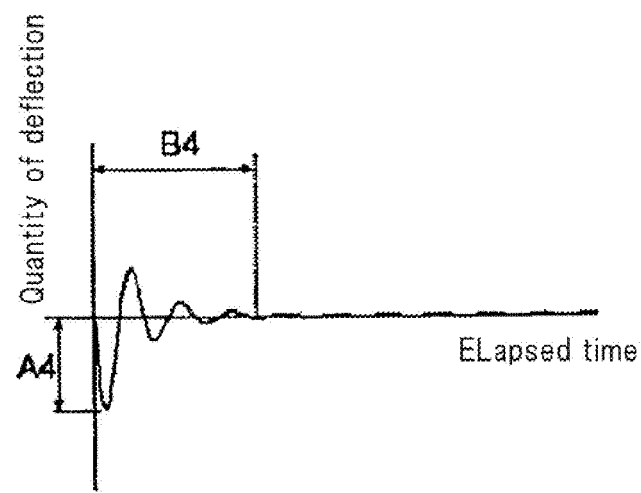
FIG. 13 is a deflection vibration waveform diagram for the case of the first embodiment.

FIG. 9(a) is an exploded perspective view of the first embodiment of the present invention, FIG. 9(b) is an assembled perspective view of the first embodiment of the present invention, and FIG. 9(c) is a sectional view taken along line A-A of FIG. 9(b). FIG. 10 shows the deflection vibration waveform of the center of the printed wiring board according to Comparative Example 1 when the impact force of a fall is applied. FIG. 11 shows the deflection vibration waveform of the center of a printed wiring board according to Comparative Example 2 when the impact force of a fall is applied. FIG. 12 shows the deflection vibration waveform of the center of a printed wiring board according to Comparative Example 3 when the impact force of a fall is applied. FIG. 13 shows the deflection vibration waveform of the center of a printed wiring board according to the first embodiment when the impact force of a fall is applied.

This embodiment is composed of a composite three-layer board construction that includes first wiring board 101, second wiring board 102, and intermediate layer 103 that is interposed between these two wiring boards. In particular, intermediate layer 103 is composed of a resin material having a dilatancy characteristic.

First wiring board 101 is a rigid printed wiring board having a base material that takes FR4 as the chief ingredient and that is provided with electrical wiring composed of copper wires, and further, has outer dimensions of 50 mm×50 mm, a thickness of 0.5 mm, and a Young's modulus of 19 GPa.

Similar to first wiring board 101, second wiring board 102 is a rigid printed wiring board that takes FR4 as its chief ingredient and that has been provided with electrical wiring composed of copper wires, and further that has outer dimensions 50 mm×50 mm, a thickness of 0.5 mm, and a Young's modulus of 19 GPa.

Intermediate layer 103 is composed of a resin material in which silicone oil as a chief ingredient is combined with boron, that has a dilatancy characteristic, and further, that has outer dimensions of 50 mm×50 mm and a thickness of 0.3 mm.

The resin material having a dilatancy characteristic is preferably a material having a Young's modulus sufficiently low to allow emulation of the surface shapes of first wiring board 101 and second wiring board 102 in a static environment and having a Young's modulus that is at least 1% of the Young's modulus of first wiring board 101 and second wiring board 102 in a dynamic environment. In the present embodiment, Tomezo (registered trademark), a product of Bouncy, was selected and used.

In the above-described construction, intermediate layer 103 is interposed between first wiring board 101 and second wiring board 102 such that their external outlines concur. The interfaces of first wiring board 101 and second wiring board 102 are next bonded by using the adhesion of intermediate layer 103 to obtain the composite three-layer board construction of the present embodiment.

The composite multilayer wiring board (a composite three-layer board construction that uses resin having a dilatancy characteristic as an intermediate layer) according to the present embodiment that was obtained as described above was individually compared with the board constructions of each of Comparative Examples 1-3.

Regarding the method of comparison, comparison results were obtained by means of a construction analysis using a finite-element method of the deflection vibration waveform of the center of a composite multilayer wiring board upon the application of an impulsive impact force caused by the impact force of a fall.

The board construction of Comparative Example 1 is a rigid printed wiring board that lacks an intermediate layer and in which electrical wiring composed of copper wiring was applied to a substrate that takes FR4 as the chief ingredient, and further, that has outer dimensions of 50 mm×50 mm, a thickness of 0.5 mm, and a Young's modulus of 19 GPa.

The board construction according to Comparative Example 2 is a composite three-layer board construction with a component shape configuration similar to the present embodiment but that uses as the intermediate layer a resin lacking a dilatancy characteristic, in this case, an epoxy resin having a Young's modulus of 7.0 GPa.

The board construction according to Comparative Example 3 is a composite three-layer board construction having a component shape configuration similar to the present embodiment but that uses as the intermediate layer a resin that lacks a dilatancy characteristic, in this case, a silicone rubber having a Young's modulus of 25 MPa.

The results of comparison are explained using FIGS. 10 to 13. The absolute values of the initial amplitude resulting from the application of impact force of each of Comparative Examples 1, 2, and 3 and the present embodiment are defined as A1, A2, A3, and A4. The elapsed time (attenuation time) until the absolute value of the residual vibration amplitude attenuates to 5% or less of the absolute value of the initial amplitude is defined as B1, B2, B3, and B4. The wave numbers at these times (maximum values) are then defined as C1, C2, C3, and C4. Thus, regarding the initial amplitudes, A4=A2<A3<A1, regarding attenuation times, B4=B3<B1<B2, and regarding wave numbers, C4=C3<C1<C2.

It is thus established that the composite multilayer wiring board according to the present embodiment exhibits an effect of reducing initial amplitude equivalent to that of the composite three-layer board construction according to Comparative Example 2 and exhibits both a reduction of the wave number of the residual vibration and the early attenuation characteristic equivalent to the composite three-layer board construction according to Comparative Example 3.

As a result, the composite multilayer wiring board according to the present embodiment, by means of an intermediate layer having a dilatancy characteristic, is capable of realizing both a reduction of initial amplitude, and early attenuation as well as a reduction of the wave number of residual vibration.

As a result, even when an impulsive external force such as the impact force of a fall is applied to printed wiring boards 101 and 102, failures such as cracking or peeling due to excessive stress that is applied to the electrical connections between printed wiring boards 101 and 102 and electronic components (not shown) can be prevented. Essentially, electronic components (not shown) on printed wiring boards 101 and 102 can be protected from the impact force of falls and the electrical and mechanical reliability of the electronic apparatus can therefore be greatly improved.

Still further, the present embodiment enables smaller size, lighter weight, higher functionality and greater multifunctionality because there is no need for special constraints upon the securing points of printed wiring boards 101 and 102, for extra space or for the addition of extra materials such as the application of shock-absorbing materials on the outside surface.

Here, the bonding between each of the interfaces between intermediate layer 103, first wiring board 101 and second wiring board 102 is most preferably realized by using the adhesive of intermediate layer 103 as in the present embodiment. However, the ends or peripheries may be bonded by using an epoxy resin adhesive within a range that does not interfere with the effect of improving electrical and mechanical reliability.

Although the thicknesses of first wiring board 101 and second wiring board 102 were identical in the present embodiment, the present invention is not limited to these thicknesses and thicknesses can be freely selected. In addition, there is no obstacle to the free selection of thickness relating to intermediate layer 103.

In the present embodiment, rigid printed wiring boards, in which a substrates that take FR4 as the chief ingredient are provided with electrical wiring composed of copper wiring, are used as first wiring board 101 and second wiring board 102, but the present invention is not limited to this form. For example, the effects of the present invention are not lost even when other materials are freely selected and combined as long as the substrate is a rigid board such as an alumina substrate, a glass ceramic substrate, or an aramid substrate. Alternatively, a rigid board without electrical wiring such as a synthetic resin in which a 40% admixture of carbon fibers is combined with PA (polyamide) can also be used.

Second Embodiment

Figure 14:
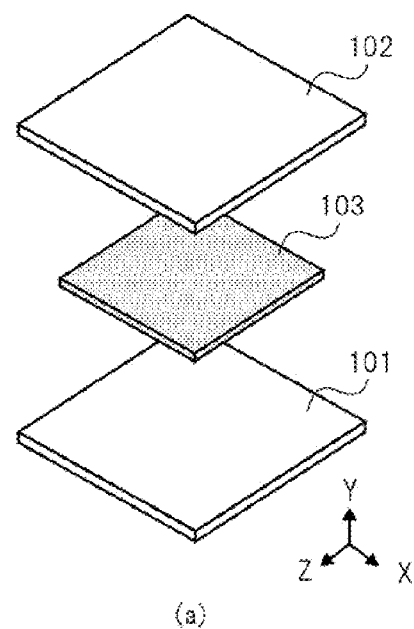
FIG. 14 is an explanatory view of the second embodiment according to the present invention.
Figure 14:
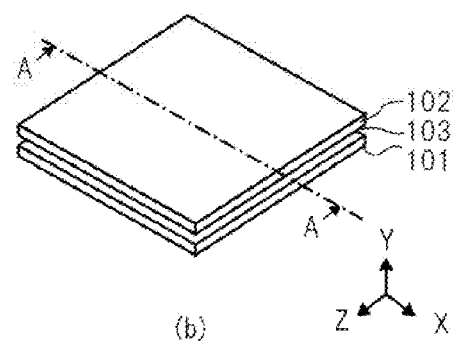
Figure 14:
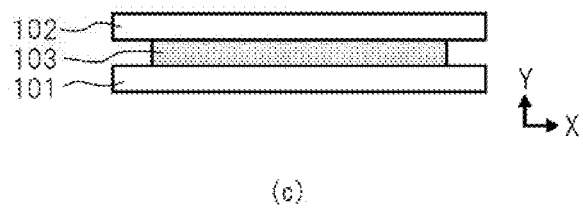

Details regarding the second embodiment of the composite multilayer wiring board according to the present invention are next described using FIG. 14.

FIG. 14(a) is an exploded perspective view of the second embodiment of the present invention, FIG. 14(b) is an assembled perspective view of the second embodiment of the present invention, and FIG. 14(c) is a sectional view taken along line A-A of FIG. 14(b).

The difference from the first embodiment is that the outer dimensions of the principal surface of intermediate layer 103 have been made smaller than the outer dimensions of the principal surfaces of first wiring board 101 and second wiring board 102.

First wiring board 101 and second wiring board 102 have the same board construction, dimensions, and Young's modulus as first wiring board 101 and second wiring board 102 of the first embodiment.

Intermediate layer 103 is composed of a resin material having a dilatancy characteristic in which silicone oil as a chief ingredient is combined with boron, and has outer dimensions of 40 mm×40 mm and a thickness of 0.3 mm. In other words, the outer dimensions of intermediate layer 103 are smaller than first wiring board 101 and second wiring board 102 that have outer dimensions of 50 mm×50 mm.

In the above-described configuration, intermediate layer 103 is interposed between first wiring board 101 and second wiring board 102 such that the external outlines concur. Bonding of the interfaces between first wiring board 101 and second wiring board 102 is then realized by using the adhesion of intermediate layer 103 to obtain the composite three-layer board construction of the present embodiment.

The area of the intermediate layer in the composite multilayer wiring board according to the present embodiment is smaller than in the first embodiment. This embodiment is therefore superior from the standpoints of reduction of component costs, the potential for mounting components in the space realized by the shape difference between first wiring board 101, second wiring board 102, and intermediate layer 103, and lighter weight. The effects are otherwise identical to the first embodiment.

In the present embodiment, the thicknesses of first wiring board 101 and second wiring board 102 are identical, but the thicknesses are not limited to this form, and the thickness can be freely selected. In addition, there is no obstacle to the free selection of thickness relating to intermediate layer 103.

In the present embodiment, moreover, rigid printed wiring boards, in which substrates that take FR4 as the chief ingredient are provided with electrical wiring composed of copper wiring, are used as first wiring board 101 and second wiring board 102, but the present invention is not limited to this form. For example, the effects of the present invention are not lost even when other materials are freely chosen and combined as long as the board is a rigid board such as an alumina board, a glass ceramic board, or an aramid board. Alternatively, a rigid board lacking electrical wiring such as a synthetic resin realized from a 40% admixture of carbon fiber in FA (polyamide) can also be used.

Still further, the outer dimensions of first wiring board 101 and second wiring board 102 are designed as 50 mm×50 mm in the present embodiment, and the outer dimensions of intermediate layer 103 are designed as 40 mm×40 mm, but there is no obstacle to making intermediate layer 103 even smaller as long as these dimensions are within the range in which the effects of the present invention are obtained when applying this invention to the product.

Third Embodiment

Figure 15:
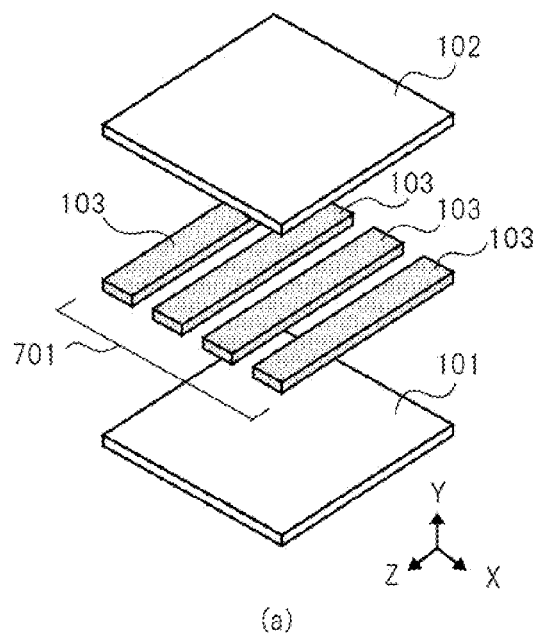
FIG. 15 is an explanatory view of the third embodiment according to the present invention.
Figure 15:
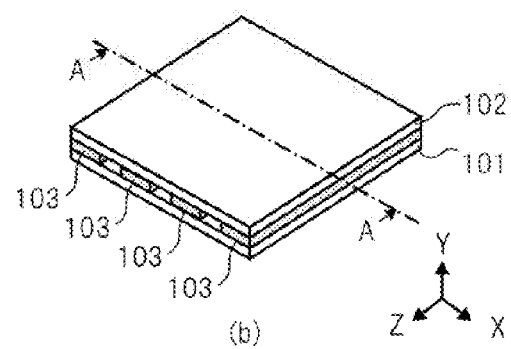
Figure 15:
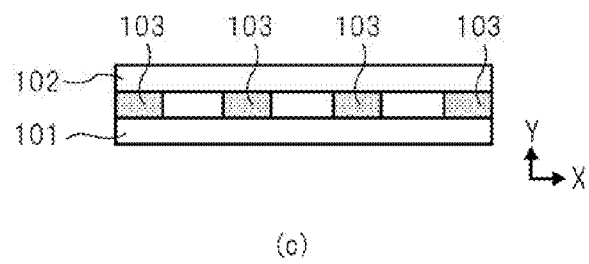

Details of the third embodiment of the composite multilayer wiring board according to the present invention are next described using FIG. 15.

FIG. 15(a) is an exploded perspective view of the third embodiment of the present invention, FIG. 15(b) is an assembled perspective view of the third embodiment of the present invention, and FIG. 15(c) is a sectional view taken along line A-A of FIG. 15(b).

The difference with the first embodiment is that intermediate layer 103 that is interposed between first wiring board 101 and second wiring board 102 is divided into strip shapes and arranged in a row separated by a vacant spaces.

First wiring board 101 and second wiring board 102 have the same board construction, dimensions, and Young's modulus as first wiring board 101 and second wiring board 102 of the first embodiment.

Intermediate layer 103 is formed as strip-shaped block group 701 constituted by strip-shaped blocks, composed of a resin material having a dilatancy characteristic and in which silicone oil as a chief ingredient is combined with boron, are arranged in a row of four at a fixed pitch in the direction of the X-axis. The strip-shaped blocks of the present embodiment have dimensions of 9.5 mm in the direction of the X-axis and 50 mm in the direction of the Z-axis, and have a thickness of 0.3 mm and a row pitch of 13.5 mm.

In the above-described configuration, strip-shaped block group 701 composed of four strip-shaped blocks is interposed between first wiring board 101 and second wiring board 102 as intermediate layer 103 such that the centers of first wiring board 101, second wiring board 102, and intermediate layer 103 coincide. Bonding of the interfaces of first wiring board 101 and second wiring board 102 is then effected using the adhesion of intermediate layer 103 to obtain the composite three-layer board construction of the present embodiment.

The composite multilayer wiring board according to the present embodiment reduces the area of the intermediate layer compared to the first embodiment, and in particular, when only the ends in the Z-axis direction are constrained, enables lighter weight without losing the effect of improving electrical and mechanical reliability. In other words, this embodiment is effective when the effect of improving electrical and mechanical reliability is desired for only one direction of the composite multilayer wiring board. In addition, the potential for mounting components in the spaces realized by shape differences between intermediate layer 103 and first wiring board 101 and second wiring board 102 can also be considered as an advantage.

Although first wiring board 101 and second wiring board 102 have identical thickness in the present embodiment, the present invention is not limited to this thickness, and any thickness can be selected. Further, there is no obstacle to free selection of thickness regarding intermediate layer 103 that is composed of strip-shaped block group 701.

Still further, although rigid printed wiring boards, in which substrates that take FR4 as a chief ingredient are provided with electrical wiring composed of copper wiring, are used for first wiring board 101 and second wiring board 102 in the present embodiment, the present invention is not limited to this form. For example, the effects of the present invention are not lost even when other materials are freely selected and combined as long as the substrate is a rigid board such as an alumina board, a glass ceramic board, or an aramid board. Still further, a rigid board that lacks electrical wiring such as a synthetic resin in which a 40% admixture of carbon fibers is combined with PA (polyamide) can also be used.

In addition, strip-shaped block group 701 is constituted by four strip-shaped blocks having dimensions of 9.5 mm in the X-axis direction and 50 mm in the Z-axis direction, and is arranged in a row in the X-axis direction with a pitch of 13.5 mm, but the present invention is not limited to this form. Accordingly, the dimensions in the X-axis direction of the strip-shaped blocks, the pitch in the X-axis direction, and the number of rows can be freely selected and need not be fixed.

The present embodiment assumes the use of the first embodiment, but the present invention is not limited to this form and similar effects can of course be obtained when applied to the second embodiment.

Still further, the strip-shaped blocks that make up strip-shaped block group 701 in the present embodiment are all formed using a resin material having a dilatancy characteristic, and this configuration is most effective for obtaining the effect of improving electrical and mechanical reliability. However, the present invention is not limited to this form. In other words, a portion of the strip-shaped blocks may be replaced with resin such as epoxy resin that does not have the dilatancy characteristic within a range that does not impede the effect of improving electrical and mechanical reliability.

The effects of the present embodiment are otherwise the same as in the first embodiment and the second embodiment and further explanation is therefore omitted.

Fourth Embodiment

Figure 16:
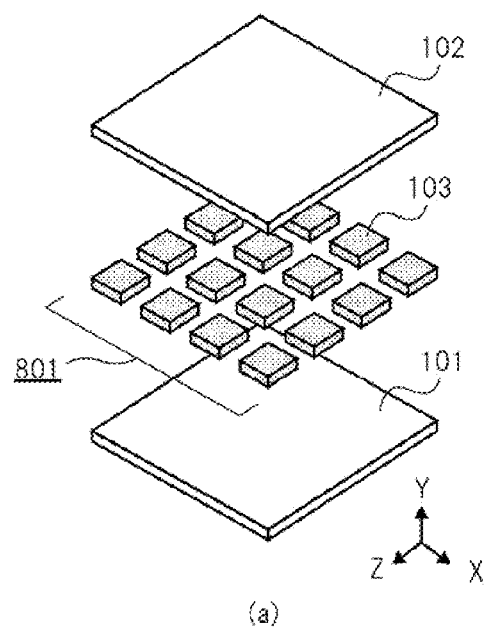
FIG. 16 is an explanatory view of the fourth embodiment according to the present invention.
Figure 16:
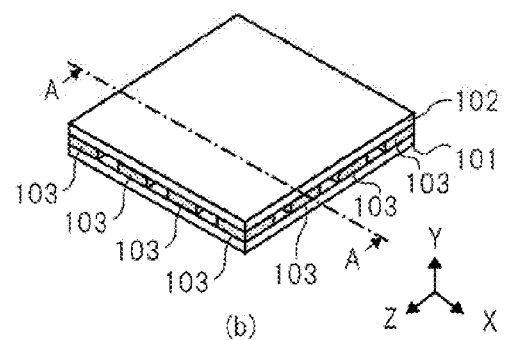
Figure 16:
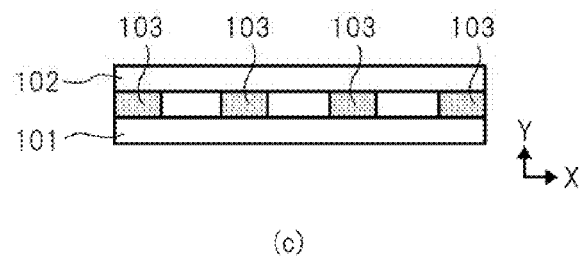

The details of the fourth embodiment of the composite multilayer wiring board according to the present invention are next explained using FIG. 16.

FIG. 16(a) is an exploded perspective view of the fourth embodiment of the present invention, FIG. 16(b) is an assembled perspective view of the fourth embodiment of the present invention, and FIG. 16(c) is a sectional view taken along line A-A of FIG. 16(b).

The difference from the first embodiment is that intermediate layer 103 that is interposed between first wiring board 101 and second wiring board 102 is divided into block shapes arranged in matrix form in rows separated by vacant spaces.

First wiring board 101 and second wiring board 102 have the same board construction, dimensions and Young's modulus as first wiring board 101 and second wiring board 102 of the first embodiment.

Intermediate layer 103 is formed by matrix-shaped block group 801 in which rectangular blocks composed of resin material having a dilatancy characteristic and in which silicone oil as a main ingredient is combined with boron are arranged in four rows in the X-axis direction and four rows in the orthogonal Y-axis direction with a fixed pitch in each direction. The rectangular blocks of this embodiment have dimensions of 9.5 mm in the X-axis direction, 9.5 mm in the Z-axis direction, a thickness of 0.3 mm, a pitch in the X-axis direction of 13.5 mm, and a pitch in the Z-axis direction of 13.5 mm.

In the above-described configuration, matrix-shaped block group 801 is interposed between first wiring board 101 and second wiring board 102 as intermediate layer 103 composed of 4×4 rectangular blocks such that the centers of first wiring board 101, second wiring board 102, and intermediate layer 103 coincide. Bonding of the interfaces of first wiring board 101 and second wiring board 102 is then effected by using the adhesion of intermediate layer 103 to obtain the composite three-layer board construction of the present embodiment.

The composite multilayer wiring board according to the present embodiment reduces the area of the intermediate layer from that of the first embodiment and is therefore superior from the standpoints of: enabling lighter weight, the ability to mount components in spaces realized by the shape differences between first wiring board 101, second wiring board 102 and intermediate layer 103, and reduction of material costs.

Although the thicknesses of first wiring board 101 and second wiring board 102 are identical in the present embodiment, the present invention is not limited to this form and thicknesses can be freely selected. In addition, there is no obstacle to the free selection of thickness relating to intermediate layer 103 that is made up of 4×4 blocks of matrix-shaped block group 801.

In the present embodiment, rigid printed wiring boards in which substrates that take FR4 as the chief ingredient are provided with electrical wiring composed of copper wiring are used for first wiring board 101 and second wiring board 102, but the present invention is not limited to this form. For example, the effects of the present invention are not lost even when other materials are freely selected and combined as long as the substrates are rigid boards such as alumina boards, glass ceramic boards, or aramid boards. Alternatively, rigid boards lacking electrical wiring such as a synthetic resin in which a 40% admixture of carbon fibers is combined with PA (polyamide) can also be used.

Although matrix-shaped block group 801 has 4×4 rectangular blocks having dimensions of 9.5 mm in the X-axis direction and 9.5 mm in the Z-axis direction arranged in four rows with a pitch of 13.5 mm in the X-axis direction and four rows with a pitch of 13.5 mm in the Z-axis direction in the present embodiment, the present invention is not limited to this form. As a result, the dimension in the X-axis direction, the pitch in the X-axis direction, the dimension in the Z-axis direction, the pitch in the Z-axis direction, and the number of arranged rows can be freely selected and need not be fixed.

Still further, all of the blocks that make up matrix-shaped block group 801 in the present embodiment are formed using a resin material having a dilatancy characteristic, and this construction is most effective for obtaining the effect of improving electrical and mechanical reliability. However, the present invention is not limited to this form, and a portion of the blocks may be replaced by a resin such as an epoxy resin that lacks a dilatancy characteristic within a range that does not hinder the effect of improving the electrical and mechanical reliability.

Although the present embodiment assumes the use of the first embodiment, it is not limited to this form and the same effects are of course obtained when applied to the second embodiment.

The effects of the present embodiment are otherwise identical to the first, second, and third embodiments, and further explanation is therefore omitted.

Fifth Embodiment

Figure 17:
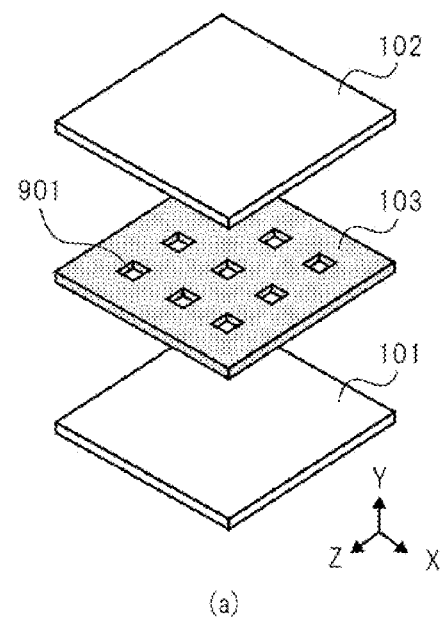
FIG. 17 is an explanatory view of the fifth embodiment according to the present invention.
Figure 17:
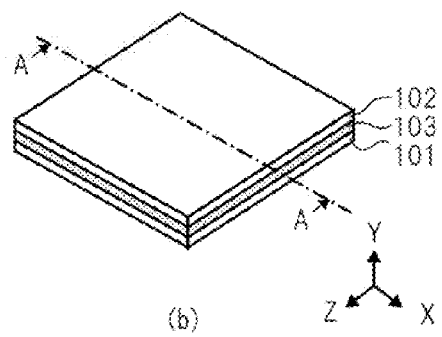
Figure 17:
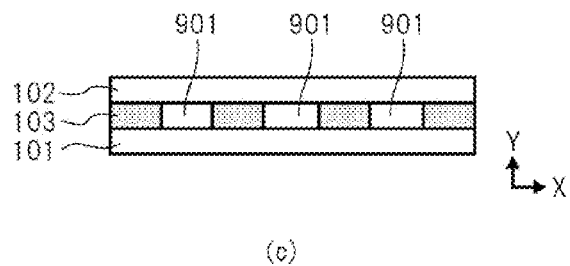

Details relating to the fifth embodiment of the composite multilayer wiring board according to the present invention are next described using FIG. 17.

FIG. 17(a) is an exploded perspective view of the fifth embodiment of the present invention, FIG. 17(b) is an assembled perspective view of the fifth embodiment of the present invention, and FIG. 17(c) is a sectional view taken along line A-A of FIG. 17(b).

The difference from the first embodiment is that intermediate layer 103 that is interposed between first wiring board 101 and second wiring board 102 includes vacant spaces 901, which are through-holes arranged in rows in matrix form.

First wiring board 101 and second wiring board 102 have the same board construction, dimensions and Young's modulus as first wiring board 101 and second wiring board 102 of the first embodiment.

Intermediate layer 103 is composed of a resin material having a dilatancy characteristic in which silicone oil as the main ingredient is combined with boron, and has outer dimensions of 50 mm×50 mm and a thickness of 0.3 mm. Rectangular vacant spaces 901 having dimensions of 4 mm in the X-axis direction, 4 mm in the Z-axis direction, and a depth of 0.3 mm are then arranged in intermediate layer 103 in 3×3 matrix form with a pitch of 13.5 mm in the X-axis direction and Z-axis direction.

In the above-described configuration, intermediate layer 103 is interposed between first wiring board 101 and second wiring board 102 such that the centers of first wiring board 101, second wiring board 102, and intermediate layer 103 coincide. Bonding of the interfaces of first wiring board 101 and second wiring board 102 is then effected by using the adhesion of intermediate layer 103 to obtain the composite three-layer board construction of the present embodiment.

The composite multilayer wiring board according to the present embodiment effects a reduction of the area of the intermediate layer compared to the first embodiment and is therefore superior from the standpoints of achieving a reduction of component costs, enabling mounting of components in the spaces obtained by shape differences of first wiring board 101, second wiring board 102, and intermediate layer 103, and achieving lighter weight.

When surface-mounted devices such as LSI are mounted on a surface that comes into contact with intermediate layer 103 of either first wiring board 101 or second wiring board 102, or both first wiring board 101 and second wiring board 102, vacant spaces 901 are preferably formed at positions and in shapes that correspond to the surface-mounted devices. By means of this configuration, an air layer that acts as a heat-insulating layer is interposed between wiring boards 101 and 102 and the surface-mounted devices, whereby the present embodiment is superior with respect to the effect of suppressing heat transfer.

Still further, if a construction is adopted in which intermediate layer 103 can press surface-mounted devices when intermediate layer 103 is interposed between first wiring board 101 and second wiring board 102 with surface-mounted devices accommodated in vacant spaces 901, an effect can be obtained by which the generated stress is reduced.

In the present embodiment, the thicknesses of first wiring board 101 and second wiring board 102 are identical, but the present invention is not limited to this form, and thickness can be freely selected. In addition, there is no obstacle to the free selection of thickness regarding intermediate layer 103.

In addition, although rigid printed wiring boards, in which substrates that take FR4 as the chief ingredient are provided with electrical wiring composed of copper wiring, are used for first wiring board 101 and second wiring board 102 in the present embodiment, the present invention is not limited to this form. The effects of the present invention are not lost even if other materials are freely selected and combined as long as the substrates are rigid boards such as alumina boards, glass ceramic boards, or aramid boards. Alternatively, a rigid board lacking electrical wiring such as a synthetic resin in which a 40% admixture of carbon fibers is combined with PA (polyamide) can also be used.

In addition, vacant spaces 901 that are formed in intermediate layer 103 in the present embodiment have dimensions of 4 mm in the X-axis direction and 4 mm in the Z-axis direction, have a depth of 0.3 mm, and are arranged in three rows in the X-axis direction and three rows in the Z-axis direction, but the present invention is not limited to this form. Accordingly, the dimensions in the X-axis direction, the pitch in the X-axis direction, the dimensions in the Z-axis direction, the pitch in the Z-axis direction, the depth, and the number of arranged rows of vacant spaces 901 may all be freely selected and need not be fixed.

Although the present embodiment assumes the use of the first embodiment, the present invention is not limited to this form, and the same effects can of course be obtained when applied to the second embodiment.

The effects of the present embodiment are otherwise identical to the first, second, third and fourth embodiments, and further explanation is therefore here omitted.

Sixth Embodiment

Figure 18:
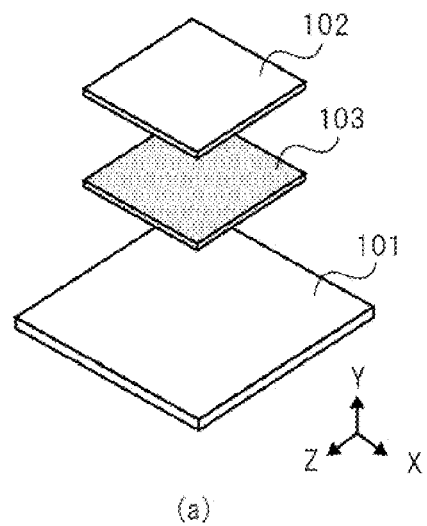
FIG. 18 is an explanatory view of the sixth embodiment according to the present invention.
Figure 18:
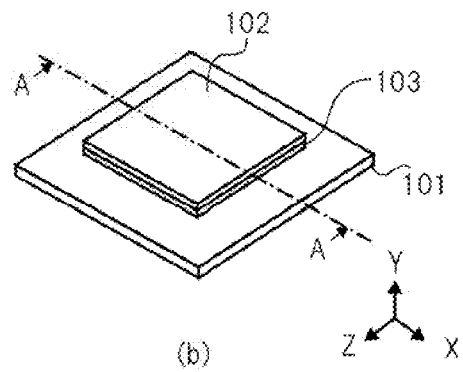
Figure 18:
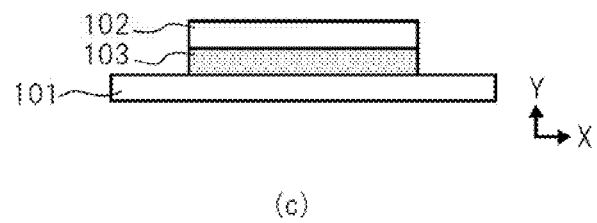

Details regarding the sixth embodiment of the composite multilayer wiring board according to the present invention are next described using FIG. 18.

FIG. 18(a) is an exploded perspective view of the sixth embodiment of the present invention, FIG. 18(b) is an assembled perspective view of the sixth embodiment of the present invention, and FIG. 18(c) is a sectional view taken along line A-A of FIG. 18(b).

The difference with the first embodiment is the smaller sizes of second wiring board 102 and intermediate layer 103 compared to first wiring board 101.

First wiring board 101 has the same board construction, dimensions, and Young's modulus as first wiring board 101 of the first embodiment.

Second wiring board 102 is a rigid printed wiring board in which a substrate that takes FR4 as chief ingredient is provided with electrical wiring composed of copper wiring, and has outer dimensions of 30 mm×30 mm, a thickness of 0.5 mm, and a Young's modulus of 19 GPa.

Intermediate layer 103 is composed of a resin material having a dilatancy characteristic and in which silicone oil as a chief ingredient is combined with boron, and has outer dimensions of 30 mm×30 mm and a thickness of 0.3 mm. In other words, the outer dimensions of second wiring board 102 and intermediate layer 103 are smaller than the outer dimensions of first wiring board 101 which are 50 mm×50 mm.

In the above-described configuration, intermediate layer 103 is interposed between first wiring board 101 and second wiring board 102 such that the centers of first wiring board 101, second wiring board 102, and intermediate layer 103 coincide. Bonding of the interfaces of first wiring board 101 and second wiring board 102 is then realized by using the adhesion of intermediate layer 103 to obtain the composite three-layer board construction of the present embodiment.

Because second wiring board 102 is smaller than first wiring board 101, the composite multilayer wiring board according to the present embodiment is superior from the standpoint of an improvement in the degree of freedom in combining wiring boards compared to the first embodiment.

In the present embodiment, first wiring board 101 and second wiring board 102 have the same thickness, but the present invention is not limited to this form and the thickness can be freely selected. In addition, there is no obstacle to the free selection of thickness relating to intermediate layer 103.

Rigid printed wiring boards, in which substrates that take FR4 as the chief ingredient are provided with electrical wiring composed of copper wiring, are used as first wiring board 101 and second wiring board 102 in the present embodiment, but the present invention is not limited to this form. For example, the effects of the present invention are not lost even when other materials are freely selected and combined as long as the substrates are rigid boards such as alumina boards, glass ceramic boards, or aramid boards. Alternatively, rigid boards lacking electrical wiring such as a synthetic resin in which a 40% admixture of carbon fiber is combined with, for example, PA (polyamide) can also be used.

Still further, although intermediate layer 103 in the present embodiment is interposed between first wiring board 101 and second wiring board 102 such that the centers of first wiring board 101, second wiring board 102, and intermediate layer 103 coincide, the present invention is not limited to this form. As a result, the positions of second wiring board 102 and intermediate layer 103 may be freely selected within a range such that they do not protrude from the outer periphery of first wiring board 101.

Although the present embodiment assumes the use of the first embodiment, the present invention is not limited to this form, and the same effects can of course be obtained when applied to the second, third, fourth, and fifth embodiments.

The effects are otherwise identical to the first, second, third, fourth, and fifth embodiments, and further explanation is therefore here omitted.

Seventh Embodiment

Figure 19:
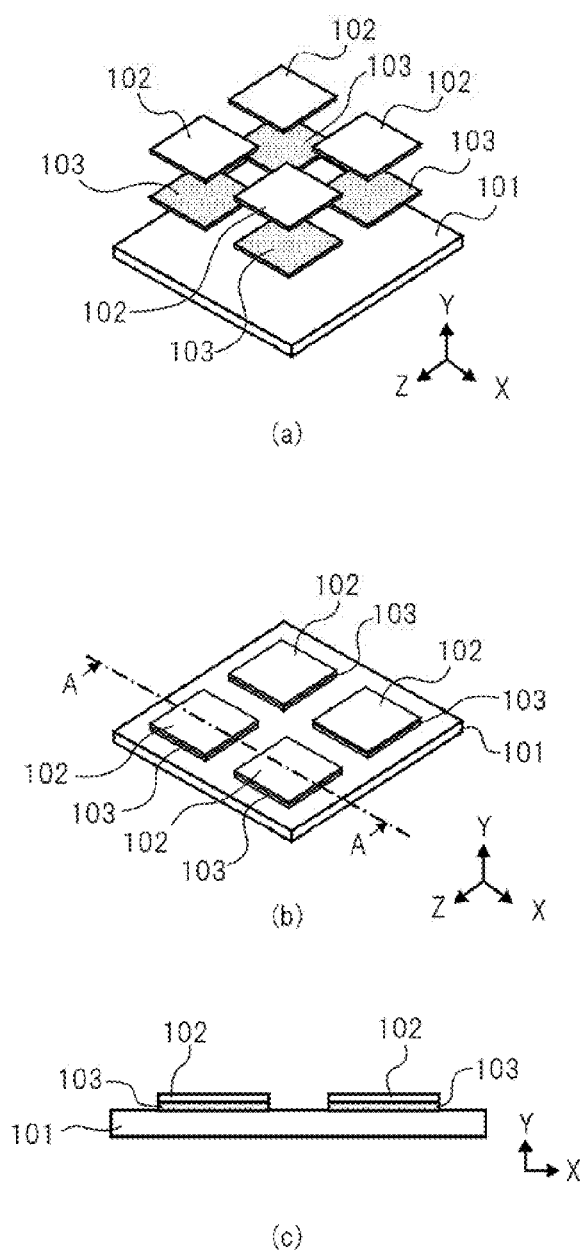
FIG. 19 is an explanatory view of the seventh embodiment according to the present invention.

Details regarding the seventh embodiment of the composite multilayer wiring board according to the present invention are next described using FIG. 19.

FIG. 19(a) is an exploded perspective view of the seventh embodiment of the present invention, FIG. 17(b) is an assembled perspective view of the seventh embodiment of the present invention, and FIG. 19(c) is a sectional view taken along line A-A of FIG. 19(b).

The difference from the first embodiment is that the sets of second wiring board 102 and corresponding intermediate layer 103 for a single first wiring board 101 are two or more.

First wiring board 101 has the same board construction, dimensions and Young's modulus as first wiring board 101 of the first embodiment.

Second wiring board 102 is a rigid printed wiring board in which a substrate that takes FR4 as chief ingredient is provided with electrical wiring composed of copper wiring, and has dimensions of 15 mm×15 mm, a thickness of 0.5 mm, and a Young's modulus of 19 GPa.

Intermediate layer 103 is composed of a resin material having a dilatancy characteristic and in which silicone oil as a chief ingredient is combined with boron, and has outer dimensions of 15 mm×15 mm and a thickness of 0.3 mm.

In the above-described construction, second wiring board 102 is arranged in two rows with a pitch of 20 mm in both the X-axis direction and Z-axis direction on first wiring board 101, and intermediate layer 103 is arranged interposed between 2×2 second wiring board 102 and first wiring board 101. Bonding between the interfaces of first wiring board 101 and second wiring board 102 is then realized by using the adhesion of intermediate layer 103 to obtain the composite three-layer board construction of the present embodiment.

The composite multilayer wiring board according to the present embodiment enables the mounting of a plurality of second wiring boards 102 with respect to first wiring board 101 and thus, compared to the first embodiment, has the advantage of providing a greater degree of freedom in combining wiring boards.

In the present embodiment, the thicknesses of first wiring board 101 and second wiring board 102 are identical, but the present invention is not limited to this form, and thickness can be freely selected. In addition, there is no obstacle to the free selection of thickness regarding intermediate layer 103.

Still further, rigid printed wiring boards, in which substrates that take FR4 as chief ingredient are provided with electrical wiring composed of copper wiring, are used as first wiring board 101 and second wiring board 102, but the present invention is not limited to this form. For example, the effects of the present invention are not lost even when other materials are freely chosen and combined as long as the substrates are rigid boards such as alumina boards, glass ceramic boards, or aramid boards. Alternatively, rigid boards lacking electrical wiring such as synthetic resin in which a 40% admixture of carbon fibers is combined with PA (polyamide) can also be used.

Although the present embodiment assumes the use of the first embodiment, the present invention is not limited to this form, and the same effects can of course be obtained when applied to the second, third, fourth, and fifth embodiments.

The effects are otherwise identical to the first, second third, fourth, fifth, and sixth embodiments, and further explanation is therefore here omitted.

Eighth Embodiment

Figure 20:
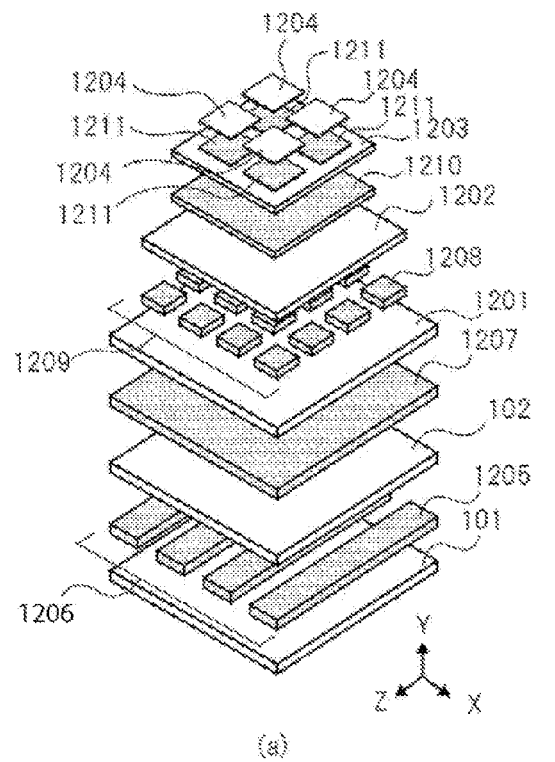
FIG. 20 is an explanatory view of the eighth embodiment according to the present invention.
Figure 20:
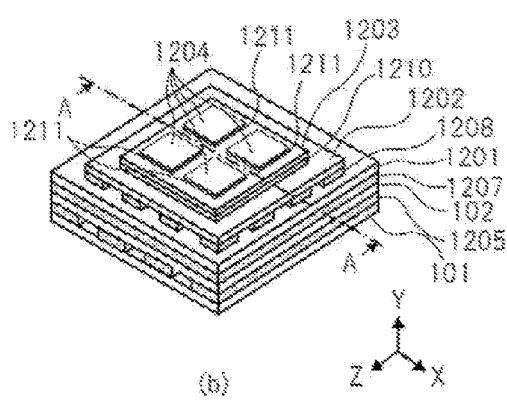
Figure 20:
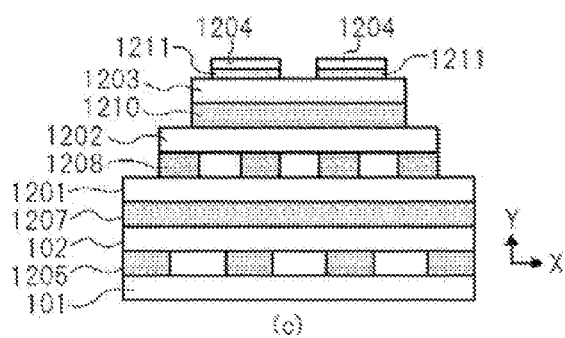

Details regarding the eighth embodiment of the composite multilayer wiring board according to the present invention are next described using FIG. 20.

FIG. 20(a) is an exploded perspective view of the eighth embodiment according to the present invention, FIG. 20(b) is an assembled perspective view of the eighth embodiment, and FIG. 20(c) is a sectional view taken along line A-A of FIG. 20(b).

The present embodiment differs from the first, second, third, fourth, fifth, sixth, and seventh embodiments by freely combining the composite multilayer board constructions of the first to seventh embodiments. In the present embodiment, intermediate layers 1205, 1207, 1208, 1210, 1211 are each interposed between six wiring boards 101, 102, 1201, 1202, 1203, and 1204.

First, second, and third wiring boards 101, 102, and 1201 have the same board construction, dimensions, and Young's modulus as first and second wiring boards 101 and 102 of the first embodiment.

Fourth wiring board 1202 is a rigid printed wiring board in which a substrate that takes FR4 as a chief ingredient is provided with electrical wiring composed of copper wiring and has outer dimensions of 40 mm×40 mm, a thickness of 0.5 mm, and a Young's modulus of 19 GPa. This fourth wiring board 1202 has smaller outer dimensions than first, second and third wiring boards 101, 102, and 1201.

Fifth wiring board 1203 is a rigid printed wiring board in which a substrate that takes FR4 as its chief ingredient is provided with electrical wiring composed of copper wiring and has outer dimensions of 30 mm×30 mm, a thickness of 0.5 mm, and a Young's modulus of 19 GPa. This fifth wiring board 1203 has smaller outer dimensions than fourth wiring board 1202.

Sixth wiring board 1204 is a rigid printed wiring board in which a substrate that takes FR4 as its chief ingredient is provided with electrical wiring composed of copper wiring, and has outer dimensions of 10 mm×10 mm, a thickness of 0.5 mm, and a Young's modulus of 19 GPa. This sixth wiring board 1204 has smaller outer dimensions than fifth wiring board 1203.

First intermediate layer 1205 is formed by strip-shaped block group 1206 in which strip-shaped blocks composed of a resin material that has a dilatancy characteristic in which silicone oil as the chief ingredient is combined with boron are arranged in four rows with a fixed pitch in the X-axis direction. These blocks each have outer dimensions of 9.5 mm in the X-axis direction (short-side dimension), 50 mm in the Z-axis direction (long-side dimension), a thickness of 0.3 mm, and are arranged in a row with a pitch of 13.5 mm in the X-axis direction.

Second intermediate layer 1207 is composed of a resin material having a dilatancy characteristic in which silicone oil as the chief ingredient is combined with boron, and has outer dimensions of 50 mm×50 mm and a thickness of 0.3 mm.

Third intermediate layer 1208 is formed by matrix-shaped block group 1209 in which rectangular blocks composed of a resin material having a dilatancy characteristic in which silicone oil as the chief ingredient is combined with boron are arranged in four rows at a fixed pitch in the X-axis direction and four rows at a fixed pitch in the Y-axis direction.

These rectangular blocks have dimensions of 7.6 mm in the X-axis direction (short-side dimension), 7.6 mm in the Z-axis direction (long-side dimension) a thickness of 0.3 mm, and are arranged in rows with a pitch of 10.8 mm in the X-axis direction and a pitch of 10.8 mm in the Z-axis direction.

Fourth intermediate layer 1210 is composed of a resin material having a dilatancy characteristic in which silicone oil as a chief ingredient is combined with boron, and has outer dimensions of 30 mm×30 mm and a thickness of 0.3 mm.

Fifth intermediate layer 1211 is composed of a resin material having a dilatancy characteristic in which silicone oil as a chief ingredient is combined with boron, and has outer dimensions of 9 mm×9 mm and a thickness of 0.3 mm.

In the above-described construction, strip-shaped block group 1206 composed of four strip-shaped blocks is interposed as first intermediate layer 1205 between first wiring board 101 and second wiring board 102 such that the centers of first and second wiring boards 101 and 102 and intermediate layer 1205 coincide. Second intermediate layer 1207 is then interposed between second wiring board 102 and third wiring board 1201 such that the external outlines of second and third wiring boards 102 and 1201 and intermediate layer 1207 concur. Third intermediate layer 1208 that is composed of 4×4 matrix-shaped block group 1209 is further interposed between third wiring board 1201 and fourth wiring board 1202 such that the centers of third and fourth wiring boards 1201 and 1202 and third intermediate layer 1208 coincide. Fourth intermediate layer 1210 is further interposed between fourth wiring board 1202 and fifth wiring board 1203 such that the centers of fourth and fifth wiring boards 1202 and 1203 and intermediate layer 1210 coincide. Finally, sixth wiring board 1204 is arranged on fifth wiring board 1203 in two rows at a pitch of 12 mm in the X-axis direction and in two rows at a pitch of 12 mm in the Z-axis direction, and fifth intermediate layer 1211 is interposed between 2×2 sixth wiring board 1204 and fifth wiring board 1203.

Bonding of the interfaces of first wiring board 101 and second wiring board 102 is effected using the adhesion of first intermediate layer 1205. Bonding of the interfaces of second wiring board 102 and third wiring board 1201 is effected using the adhesion of second intermediate layer 1207. Bonding of the interfaces of third wiring board 1201 and fourth wiring board 1202 is effected using the adhesion of third intermediate layer 1208. Bonding of the interfaces of fourth wiring board 1202 and fifth wiring board 1203 is effected using the adhesion of fourth intermediate layer 1210. Bonding of the interfaces of fifth wiring board 1203 and sixth wiring board 1204 is effected using the adhesion of fifth intermediate layer 1211. The composite multilayer (11-layered board in this case) board construction of the present embodiment is thus obtained.

The composite multilayer wiring board according to the present embodiment has the effects of achieving higher functionality and greater multifunctionality due to the improvement in the degree of freedom of combining wiring boards and a major increase of wiring efficiency per unit of projected area.

In the case of a composite multilayer board of five or more layers, using a resin that has a dilatancy characteristic in the intermediate layer, that is farthest from the neutral plane of this composite multilayer board, has the effect of improving electrical and mechanical reliability. There is consequently no absolute necessity for using a resin material having a dilatancy characteristic in other intermediate layers as long as it is within a range that does not detract from the effect of improving the electrical and mechanical reliability. As a result, this resin material may be replaced by a resin that lacks the dilatancy characteristic such as a low-cost epoxy resin or silicone rubber. In addition, "neutral plane" that is described in the patent claims and specification of the present invention refers to a "neutral plane" in material dynamics when considering the flexural deformation of a composite multilayer wiring board.

Although rigid printed wiring boards in which substrates that take FR4 as a chief ingredient are provided with electrical wiring composed of copper wiring are used for wiring boards 101, 102, 1201, 1202, 1203, and 1204 in the present embodiment, the present invention is not limited to this form. For example, the effects of the present invention are not lost even when other materials are freely selected and combined as long as these are rigid boards such as alumina boards, glass ceramic boards, and aramid boards. Alternatively, rigid boards that lack electrical wiring such as a synthetic resin in which a 40% admixture of carbon fibers is combined with PA (polyamide) can also be used.

In the present embodiment, strip-shaped block group 1206 composed of the same construction and materials as the strip-shaped block group shown in the third embodiment is applied for first intermediate layer 1205, and the same construction and materials as the intermediate layer shown in the first embodiment is applied for second intermediate layer 1207.

Alternatively, strip-shaped block group 1206, which is first intermediate layer 1205, that is rotated 90° around the Y-axis, i.e., a strip-shaped block group in which four strip-shaped blocks having dimensions of 50 mm in the X-axis direction and 9.5 mm in the Z-axis direction and a thickness of 0.3 mm are arranged in a row at a pitch of 13.5 mm in the Z-axis direction can be used for second intermediate layer 1207. This form enables lighter weight without any loss of the effect of improving electrical and mechanical reliability not only when using a form in which only the ends in the Z-axis direction are constrained, but also when using a form in which only the ends are constrained in the X-axis direction or in which ends are constrained in both the X-axis and Z-axis directions.

In addition, the same effects as described hereinabove can be obtained by using, for second intermediate layer 1207, a matrix-shaped block group that is provided in arrangement and block sizes that complement matrix-shaped block group 1209 of third intermediate layer 1208.

Although the present embodiment presupposes the use of the first, third, fourth, and seventh embodiments, the present invention is not limited to this form, and the same effects can of course be obtained when applying the second, fifth, and sixth embodiments. As a result, the present embodiment may take the form of any one or a combination of the first to seventh embodiments.

The effects are otherwise identical to the first to seventh embodiments, and further explanation is therefore omitted.

Ninth Embodiment

Figure 21:
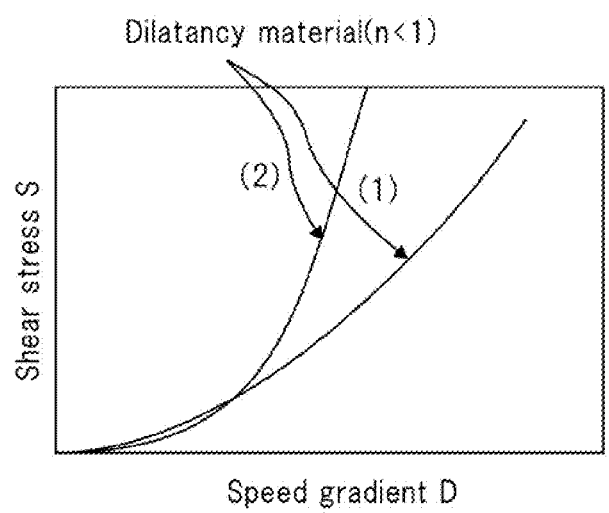
FIG. 21 is an explanatory view of the ninth embodiment according to the present invention.

Details regarding the ninth embodiment of the composite multilayer wiring board according to the present invention are next described using FIG. 21.

FIG. 21 is a characteristics chart showing the relation between speed gradient D and shear stress S of resin having a dilatancy characteristic that is used in the ninth embodiment of the present invention.

The difference from the first embodiment is the modification of the dilatancy characteristic of the intermediate layer.

The ninth embodiment of the present invention is characterized by, in a composite multilayer wiring board that is identical to the form described in the first embodiment, selecting a resin for which n is smaller than in the first embodiment for intermediate layer 103 when using resins having a dilatancy characteristic represented by n<1 in Formula 1 such as shown in FIG. 21. In other words, making n smaller results in the use of a resin that has a characteristic whereby the rate of increase of shear stress S rises more sharply with respect to the increase in speed gradient D, as shown by (2) compared to (1) in FIG. 21.

According to the present embodiment, in the event of the application of an impulsive outer force such as the impact force of a fall on a printed wiring board, the effect of protecting the printed wiring board and the electronic components that are mounted on the board from the impact force of the fall is improved compared to the first embodiment.

Although the present embodiment presupposes the use of the first embodiment, the present invention is not limited to this form, and the same effects can of course be obtained even when applied to the second, third, fourth, fifth, sixth, seventh, and eighth embodiments.

The effects are otherwise identical to the first, second, third, fourth, fifth, sixth, seventh, and eighth embodiments, and further explanation is therefore omitted.

Although explanation regarded embodiments of the present invention, the invention of the present application is not limited to these embodiments and is obviously open to various modifications within the scope of the technical idea of the invention.

What is claimed is:

1. A composite multilayer wiring board comprising: a plurality of printed wiring boards, and a plurality of intermediate layers each interposed between a plurality of said printed wiring boards; wherein at least one of said plurality of intermediate layers is composed of a resin material that has a dilatancy characteristic; wherein said intermediate layer at the position most distant from a neutral plane of the composite multilayer wiring board is composed of the resin that has the dilatancy characteristic and wherein said intermediate layer at the position most distant from said neutral plane suppresses a shearing stress that accompanies a deformation velocity of said intermediate layer at the position most distant from said neutral plane due to the dilatancy characteristic of said intermediate layer at the position most distant from said neutral plane.

2. The composite multilayer wiring board as set forth in claim 1, wherein all of said plurality of intermediate layers are composed of a resin material having a dilatancy characteristic.

3. The composite multilayer wiring board as set forth in claim 1, wherein hole-shaped vacancies are formed in said intermediate layer.

4. The composite multilayer wiring board as set forth in claim 3, wherein said vacancies are arranged in rows in matrix form.

5. The composite multilayer wiring board as set forth in claim 1, wherein said intermediate layer is made up by a strip-shaped block group in which strip-shaped blocks are arranged in parallel rows in the direction of the short sides of the blocks.

6. The composite multilayer wiring board as set forth in claim 5, wherein said strip-shaped blocks are arranged such that the long sides of these blocks are orthogonal to the long sides of strip-shaped blocks that make up another said intermediate layer.

7. The composite multilayer wiring board as set forth in claim 1, wherein said intermediate layer is formed by a matrix-shaped block group in which rectangular blocks, for which both short sides and long sides have dimensions that are no greater than half the outer dimensions of the principal surfaces of said printed wiring boards, are arranged in rows in matrix form.

8. The composite multilayer wiring board as set forth in claim 1, wherein said intermediate layer and said printed wiring boards are bonded by the adhesion of said intermediate layer.

9. The composite multilayer wiring board as set forth in claim 1, wherein the outer dimensions of the principal surface of said intermediate layer are smaller than the outer dimensions of the principal surfaces of said printed wiring boards.

10. The composite multilayer wiring board as set forth in claim 1, wherein just said intermediate layer at the position most distance from said neutral plane has the dilatancy characteristic, and no other intermediate layer has the dilatancy characteristic.

* * * * *